United States Patent
Kawana et al.

(10) Patent No.: US 8,067,296 B2
(45) Date of Patent: Nov. 29, 2011

(54) METHOD OF MANUFACTURING SEMICONDUCTOR DEVICE

(75) Inventors: Yoshiyuki Kawana, Atsugi (JP); Naoki Sano, Yokohama (JP)

(73) Assignees: Success International Corporation (JP); Hightec Systems Corporation (JP)

( * ) Notice: Subject to any disclaimer, the term of this patent is extended or adjusted under 35 U.S.C. 154(b) by 350 days.

(21) Appl. No.: 12/094,756

(22) PCT Filed: Nov. 8, 2006

(86) PCT No.: PCT/JP2006/322272
§ 371 (c)(1),
(2), (4) Date: May 22, 2008

(87) PCT Pub. No.: WO2007/060837
PCT Pub. Date: May 31, 2007

(65) Prior Publication Data
US 2010/0190296 A1 Jul. 29, 2010

(30) Foreign Application Priority Data
Nov. 22, 2005 (JP) ................................ 2005-365478

(51) Int. Cl.
*H01L 21/46* (2006.01)
*H01L 21/78* (2006.01)
*H01L 21/301* (2006.01)

(52) U.S. Cl. . 438/460; 438/113; 438/513; 257/E21.006; 257/E21.054; 257/E21.077; 257/E21.095; 257/E21.134; 257/E21.218; 257/E21.237; 257/E21.324; 257/E21.347

(58) Field of Classification Search .................. 438/105, 438/113, 460, 463, 509, 513, 530, 535, 687, 438/688, 782; 257/E21.006, 54, 77, 95, 134, 257/218, 237, 324, 347
See application file for complete search history.

(56) References Cited

U.S. PATENT DOCUMENTS

| | | | | |
|---|---|---|---|---|
| 6,757,048 | B2 * | 6/2004 | Arakawa | 355/30 |
| 6,891,593 | B2 * | 5/2005 | Arakawa | 355/30 |
| 7,034,918 | B2 * | 4/2006 | Arakawa | 355/30 |
| 2009/0283647 | A1 * | 11/2009 | Yasunaga et al. | 248/123.2 |

FOREIGN PATENT DOCUMENTS

| | | |
|---|---|---|
| JP | 62-190836 A | 8/1987 |
| JP | 7-142423 A | 6/1995 |
| JP | 2005-175207 A | 6/2005 |

* cited by examiner

*Primary Examiner* — David Nhu
(74) *Attorney, Agent, or Firm* — Stevens Law Group; David R. Stevens

(57) ABSTRACT

The present invention provides a method of manufacturing a semiconductor device in which a thinned substrate of a semiconductor or semiconductor device is handled without cracks in the substrate and treated with heat to improve a contact between semiconductor back surface and metal in a high yield and a semiconductor device may be manufactured in a high yield. In the method of manufacturing a semiconductor device according to the present invention, a notched part is formed from a surface to a middle in a semiconductor substrate by dicing and the surface of the substrate is fixed to a support base. Next, a back surface of the substrate is ground to thin the semiconductor substrate and then a metal electrode and a carbon film that is a heat receiving layer are sequentially formed on the back surface of the substrate. Next, the carbon film is irradiated with light at a power density of 1 kW/cm² to 1 MW/cm² for a short time of 0.01 ms to 10 ms to transfer heat from the carbon film and alloy an interface between a semiconductor and the metal electrode. Subsequently, the semiconductor substrate is separated at the notched part into pieces.

14 Claims, 5 Drawing Sheets

METHOD OF MANUFACTURING SEMICONDUCTOR DEVICE

TECHNICAL FIELD

The present invention relates to a method of manufacturing a semiconductor device. More particularly, the present invention relates to a method of manufacturing a semiconductor device including a process of performing heat treatment to form a metal contact on a semiconductor.

BACKGROUND ART

In the manufacture of semiconductor devices such as various semiconductor elements and semiconductor integrated circuits including bipolar transistors and insulated gate field effect transistors (MOS transistors) in the related art, in order to form a contact between semiconductor and metal, a metal layer has usually been deposited on a surface of a semiconductor to receive heat treatment by maintaining them at a predetermined temperature in an annealing furnace in an atmosphere of inert gas or the like for a certain time so that an electric characteristic between the semiconductor and the metal has been improved to obtain an excellent ohmic characteristic (see Patent Document 1, for example).

When gold (Au) is formed as a contact layer for silicon (Si), it is usual to heat treat them in an inert gas to a temperature higher than a Si/Au eutectic temperature of 373° C. to obtain an excellent contact. It is possible to deposit aluminum (Al) on silicon and then deposit a plurality of metal layers. In this case, it is usual to perform heat treatment at about 450° C. to improve a Si/Al contact after depositing the plurality of metal layers on the silicon.

Patent Document 1: Japanese Unexamined Patent Application Publication No. 6-120165

DISCLOSURE OF INVENTION

However, in recent years, there is a significant demand for thinning substrates extremely and therefore new measures may be necessary. Thin substrates may be required based on a demand for thinning semiconductor packages. In the case of a MOS device or the like where an ohmic electrode may not be formed on a back surface, a thick substrate is previously diced from a surface to a middle in a depth direction of the substrate; the surface with the above cut is attached to a substrate support base for grinding; the substrate is thinned to 100 μm or less by grinding and etching; and then the thinned substrate is removed from the substrate support base so that a singulated thinned die may be obtained.

On the other hand, in the case of a power device or the like where an ohmic electrode is formed on a back surface, it is necessary to thin a back surface of a substrate by grinding; then wash and dry the substrate; then insert the substrate into a sputtering apparatus to deposit a metal layer on the back surface; and remove the substrate therefrom and insert the substrate into an annealing furnace to perform heat treatment. During this process, the thinned substrate is extremely difficult to be handled, damages such as cracks tend to occur in the substrate and a yield is reduced; this has been a huge problem.

The present invention intends to solve this problem.

To attain the aforementioned object, a method of manufacturing a semiconductor device according to the first invention is characterized by including: forming a notched part by dicing from a surface to a middle in a semiconductor substrate and fixing the surface of the semiconductor substrate to a substrate support base; grinding a back surface of the semiconductor substrate to thin the semiconductor substrate; depositing a metal layer on the back surface of the semiconductor substrate and forming a diamond-like carbon film or an amorphous carbon film (hereinafter referred to as "carbon film") that is a heat receiving layer on the metal layer; irradiating a surface of the carbon film with light at a power density of 1 kW/cm$^2$ to 1 MW/cm$^2$ for a short time of 0.01 ms to 10 ms to heat treat the metal layer and a semiconductor in contact with the metal layer at a predetermined temperature; and separating the semiconductor substrate at the notched part into pieces.

A method of manufacturing a semiconductor device according to the second invention is characterized by including: fixing a surface of the semiconductor substrate to the substrate support base and then grinding and etching a back surface of the semiconductor substrate to thin the semiconductor substrate; depositing a metal layer on the back surface of the semiconductor substrate and forming a diamond-like carbon film or an amorphous carbon film (hereinafter referred to as "carbon film") that is a heat receiving layer on the metal layer; irradiating a surface of the carbon film with light at a power density of 1 kW/cm$^2$ to 1 MW/cm$^2$ for a short time of 0.01 ms to 10 ms to heat treat the metal layer and a semiconductor in contact with the metal layer at a predetermined temperature; and dicing from the back surface and separating the semiconductor substrate into pieces.

Further, the present invention is characterized in that the metal layer is formed of one layer or a plurality of layers in the first and second inventions.

Further, the present invention is characterized in that the light irradiation is carried out by pulse irradiation using a flash lamp as a light source in the first and second inventions.

Further, the present invention is characterized in that the light irradiation is carried out by pulse irradiation using pulse wave laser light as a light source in the first and second inventions.

Further, the present invention is characterized in that the light irradiation is carried out by beam scanning using continuous wave laser light as a light source in the first and second inventions.

Further, the present invention is characterized in that the carbon film is formed by depositing carbon fine particles having a particle size of 1 μm or less in the first and second inventions.

Further, the present invention is characterized in that the deposited film is formed by applying the carbon fine particles dispersed in water or a silicone oil nonpolar solvent by spin coating in the first and second inventions.

Note that the carbon film in the present invention may have a small amount of impurities such as hydrogen as impurities mixed during deposition.

As described above, according to the present invention, the steps of thinning a semiconductor substrate by grinding; forming a metal film on the semiconductor substrate thinned; and heat-treating the substrate to improve a contact characteristic are performed with the semiconductor substrate being attached to a substrate support base, unlike a method of the related art where a substrate having been thinned is handled to perform metal formation and heat treatment to improve a contact characteristic. Therefore, the series of steps may be performed without cracks occurred in the substrate. The semiconductor substrate may be easily separated into pieces thereafter.

In the present invention, a thin (for example, about 0.2 μm-thick) carbon film is formed on a metal layer after depositing the metal layer on a back surface of a semiconductor substrate. The carbon film is an excellent heat absorbing material against light irradiation. The carbon film having an optical absorbance of 40% as a light absorption characteristic may be easily formed in the range of 400 nm to 1000 nm in wavelength depending on a deposition method and a deposition condition for the carbon film. In the case where strong flash lamp light or laser light is applied onto this structure in a related art method, since a metal electrode is exposed on an outermost surface and the metal generally has an extremely high light reflectance, most of incident light energy is lost as reflected light and may not contribute to the improvement in a contact characteristic at the interface between semiconductor and metal. On the other hand, in the present invention, extremely efficiently incident light energy is absorbed in the carbon film and converted into thermal energy, and this energy may improve a contact characteristic between the semiconductor and the metal. Therefore, the energy for this heat process may be easily saved.

Further, heat treatment in a furnace according to a related art method needs 30 minutes or more. However, according to the present invention, the treatment for the whole substrate surface may be completed by light irradiation for an extremely short time, thereby reducing a process time considerably.

Accordingly, the yield in a process of manufacturing a semiconductor element using a thin semiconductor substrate having a metal contact on a back surface may be improved using the manufacturing method of the present invention. Steps of the manufacturing process may also be reduced considerably. This may be a great advance in the field of power devices or the like having a substrate with a thickness of 100 μm or less. Accordingly, on-resistance of a semiconductor element such as a power MOS transistor can be reduced, so that energy saving during operation of the element can be achieved.

BEST MODE FOR CARRYING OUT THE INVENTION

An embodiment of the present invention will be described below with reference to drawings. However, the present invention is not limited thereto.

Figure 1:
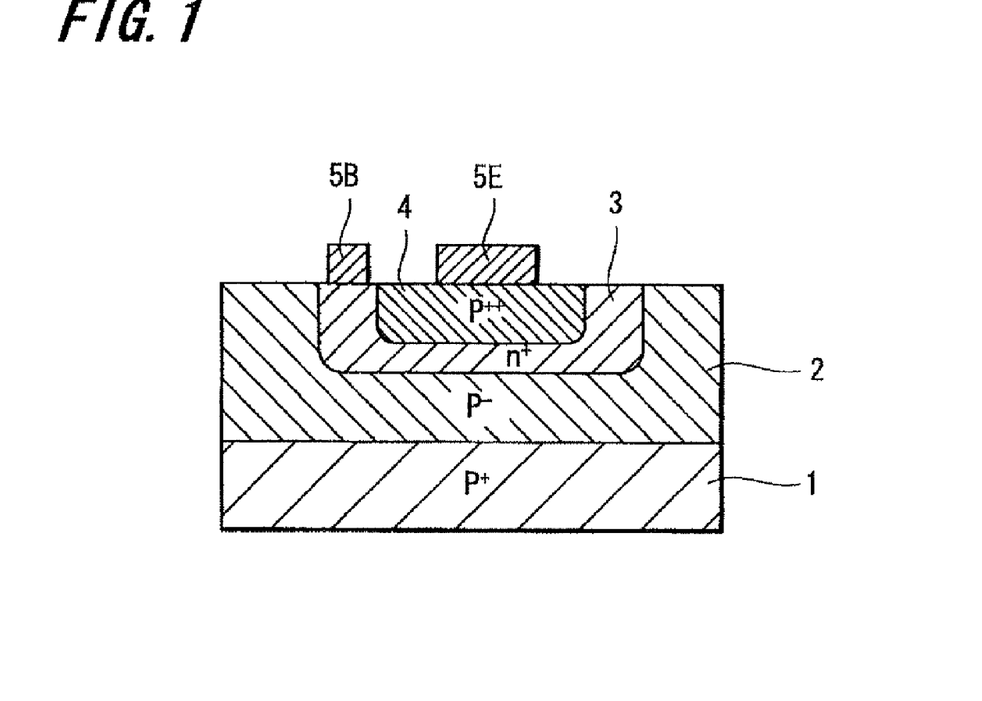
FIG. 1 is a cross-sectional view showing an embodiment of a semiconductor element to which the method of forming a contact between semiconductor and metal according to the present invention is applied.

FIG. 1 shows a schematic cross-sectional view of a semiconductor element having a standard planar pnp transistor structure. There will be described below an embodiment of the manufacturing method of the present invention including a method for heat-treating a semiconductor element having the pnp transistor structure.

First, a semiconductor element having a pnp transistor structure is formed on a substrate 1 as shown in FIG. 1. A semiconductor substrate, which is here a silicon substrate, is used as the substrate 1. The substrate is not particularly limited in terms of size and may be a typical silicon substrate having a diameter of 200 mm and a thickness of about 500 μm, for example. The semiconductor element (device structure) is formed as a pnp transistor by forming a $p^{31}$ epitaxial layer 2 on the $p^+$ semiconductor substrate 1 and forming an $n^+$ layer 3 and a $p^{++}$ layer 4 by ion implantation through a mask. The $p^+$ semiconductor substrate 1 and the $p^{31}$ epitaxial layer 2 are collectors, the $n^+$ layer 3 is a base and the $p^{++}$ layer 4 is an emitter. A base electrode 5B and an emitter electrode 5E that are metal electrodes are formed on the $n^+$ layer 3 and the $p^{++}$ layer 4 to provide an ohmic contact, respectively. An area of each of the $n^+$ layer 3 and the $p^{++}$ layer 4 in contact with the metal electrode is doped with a dopant at a high concentration. Al or Au may be used as a metal electrode material, for example. The base electrode 5B and the emitter electrode 5E may be deposited by a method such as sputtering or vacuum evaporation, for example. As described above, a substrate back surface corresponds to a collector part, but a metal electrode that is a collector electrode has not yet been formed.

Figure 2:
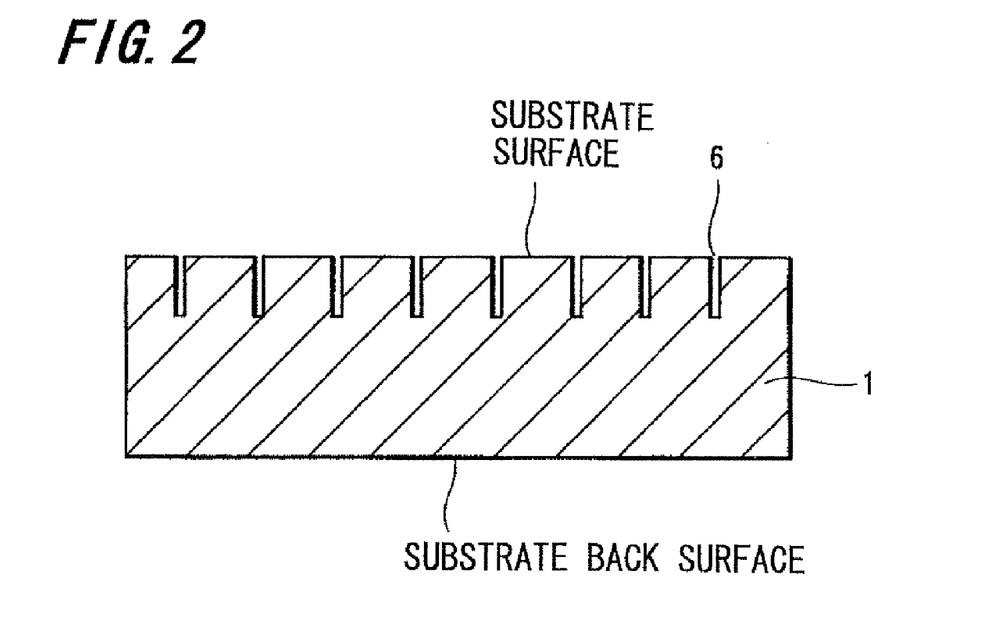
FIG. 2 is a process view (1) showing an embodiment of the method of manufacturing a semiconductor device according to the present invention and is a cross-sectional view of a substrate with a processed substrate surface half-diced.

Next, as shown in FIG. 2, a notched part 6 for dividing respective semiconductor elements is formed in the semiconductor substrate, that is, the silicon substrate 1 subjected to the above surface process. That is, a surface of the silicon substrate 1 is half-diced to prepare the notched part 6 at a depth of 50 μm or less. The notched part 6 is prepared to facilitate dividing of the substrate into respective dies (so-called semiconductor chips) in the final singulation step.

Figure 3:
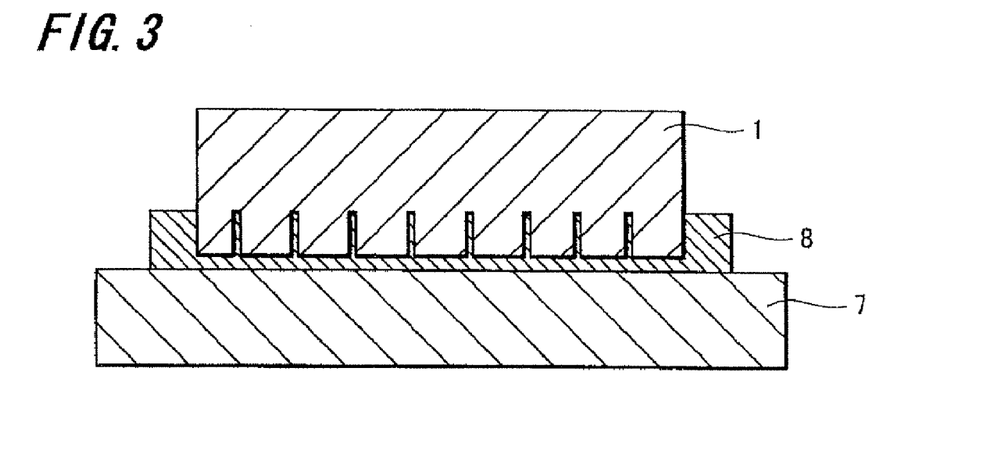
FIG. 3 is a process view (2) showing an embodiment of the method of manufacturing a semiconductor device according to the present invention and is a cross-sectional view of a state where a half-diced substrate is attached to a support base for grinding, with a main surface of the substrate as a surface attached.

Next, as shown in FIG. 3, after completing process on the substrate surface, the surface of the silicon substrate 1 is fixed to a substrate support base (hereinafter referred to as "support base") 7 for grinding to start grinding the substrate back surface. The silicon substrate 1 may be fixed using any method such as a typical method using a wax 8; a method using a pressure sensitive adhesive used on a dicing tape or another adhesive; or a method of chucking the substrate to the support base by vacuum suction. However, in the case of fixing using a chemical substance such as a wax or pressure sensitive adhesive, it is desirable to select a highly heat resistant (refractory) chemical substance resistant to a temperature in heat treatment thereafter or a chemical substance not generating a large amount of gas at a high temperature. It is also important to select a material resistant to chemical treatment thereafter (in particular, alkali treatment in a final grinding step).

Figure 4:
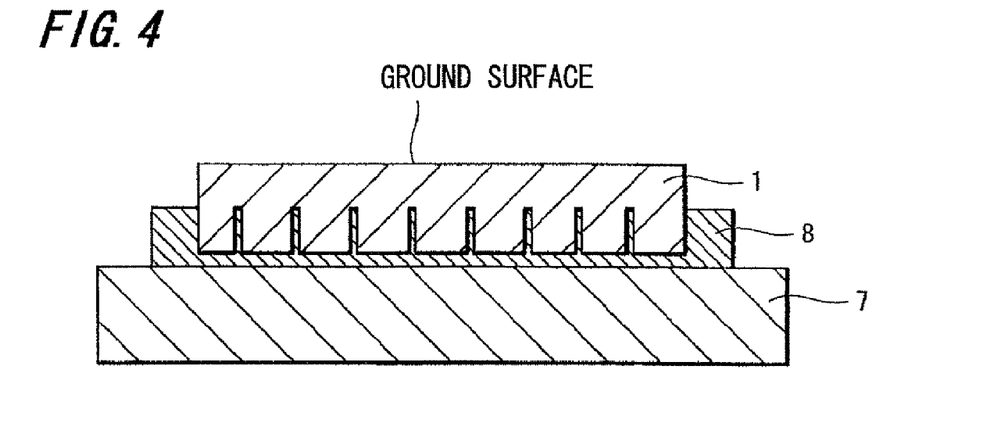
FIG. 4 is a process view (3) showing an embodiment of the method of manufacturing a semiconductor device according to the present invention and is a cross-sectional view of a state where a substrate is thinned by performing a grinding step with the substrate attached to a support base for the step.

The grinding step may be performed using a typical technique. The grinding step is performed by abrasion and polishing in this order to gradually increase plane accuracy. For example, a silicon substrate having a thickness of 500 μm may be abraded by about 350 μm to obtain a substrate thickness of about 150 μm and further ground by polishing by about 100 μm to 50 μm to reduce the thickness thereof. In this case, the substrate has a thickness of about 50 μm to 100 μm after the finishing polish. Finally, etching by about 2 μm to 50 μm is performed as chemical polishing using an etching solution; this is the final step of grinding. Obviously, a thickness after grinding or polishing in each process may be appropriately determined. After this step, the substrate 1 may be thinned to have a thickness of about 50 μm as shown in FIG. 4.

Figure 5:
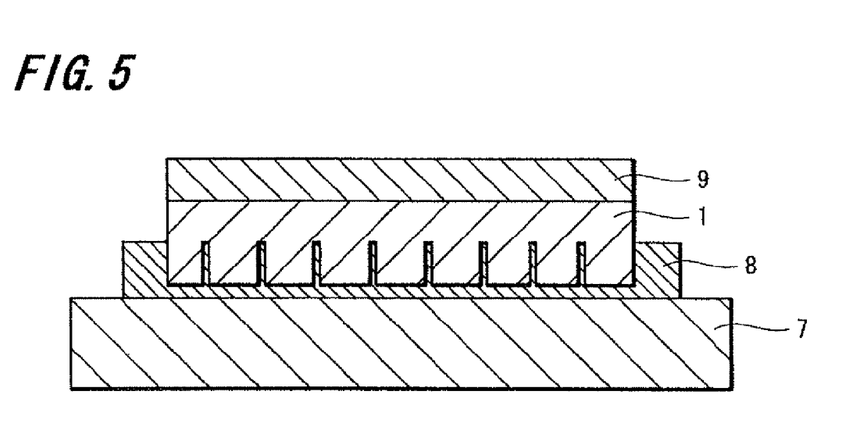
FIG. 5 is a process view (4) showing an embodiment of the method of manufacturing a semiconductor device according to the present invention and is a cross-sectional view of a state where a back surface electrode is formed on a thinned substrate attached to a support base for the above step.
Figure 6:
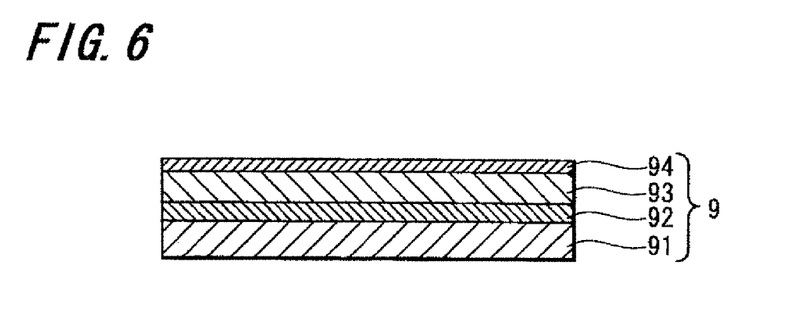
FIG. 6 is a cross-sectional view showing an example of the back surface electrode of the present invention having a multilayer structure.

Next, as shown in FIG. 5, a metal electrode 9 is formed on the whole back surface (ground surface) of the thinned substrate. The metal electrode 9 corresponds to the collector electrode of the pnp transistor shown in FIG. 1. The metal electrode 9 may be an Au electrode having a thickness of about 0.5 μm, for example. The metal electrode 9 may have a structure including a plurality of metal layers of an aluminum (Al) film 91, a nickel (Ni) film 92, a copper (Cu) film 93 and a gold (Au) film 94 stacked as shown in FIG. 6, for example. An electrode having a multilayer structure of 2 μm-thick Al/0.3 μm-thick Ni/2 μm-thick Cu/0.1 μm-thick Au (with an uppermost surface formed by Au) may be formed on the back surface of the silicon substrate 1, for example. However, the thickness of each of the plurality of metal films is not limited thereto.

Figure 7:
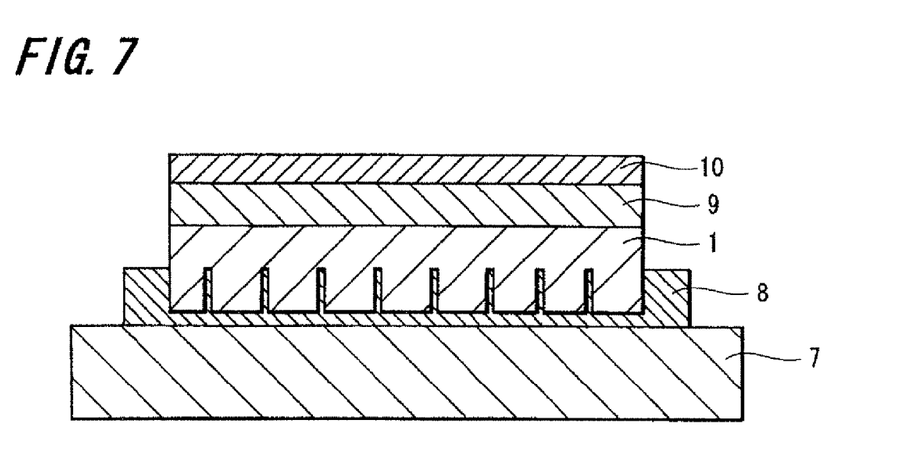
FIG. 7 is a process view (5) showing an embodiment of the method of manufacturing a semiconductor device according to the present invention and is a cross-sectional view showing a state where a carbon film as a light absorbing layer is formed after forming a back surface electrode.

Next, as shown in FIG. 7, a carbon film 10 as a light absorbing layer is deposited on the metal electrode 9 on the substrate back surface. The carbon film 10 is a heat receiving layer. A diamond-like carbon or amorphous carbon film is used as the carbon film 10. The carbon film 10 appropriately has a thickness of about 50 nm to 500 nm. The carbon film 10 may be deposited by a method such as sputtering, CVD or ionized evaporation. For example, in the case of sputtering, a carbon film is deposited on a substrate facing a graphite carbon target by discharging gas such as argon (Ar) with DC or AC voltage being applied. In the case of CVD, the carbon film is deposited by discharging $C_2H_2$ gas, drawing ionic species made by discharge decomposition to the substrate using substrate bias, and maintaining plasma at a high density by applying a magnetic field, for example. However, the deposition method is not necessarily limited thereto.

For example, the carbon film 10 may be formed as a film obtained by depositing a fine particle of black ink in which graphite fine particles having a particle size of 1 μm or less are dispersed and stabilized in water or a silicone oil nonpolar solvent (such as a dimethylsilicone oil nonpolar solvent) using various methods including wet coating such as spin coating. The fine particle deposited film may be readily formed by the aforementioned method. Such an amorphous carbon film is preferable in terms of ease of manufacture.

The carbon film 10 is preferably a film highly resistant to light irradiation at a high power density for a short time thereafter. This is because a film not resistant to high light irradiating power may cause a film breaking phenomenon such as ablation during a short-time light irradiation and thus heat energy converted from light energy is not efficiently transferred to a ground substrate layer. Adhesion of a ground metal material to the carbon film is also important for the same reason.

Accordingly, the carbon film 10 is preferably a film having relatively high hardness such as a diamond-like carbon (DLC) film having heat resistance and durability in strength together. However, DLC generally contains hydrogen in many cases and has an optical absorbance easily reduced in this case. Therefore, it is more desirable to select a deposition condition and a thickness of the carbon film so that the film has an optical absorbance of 80% or more in the range of wavelengths of 400 nm to 1000 nm.

Figure 8:
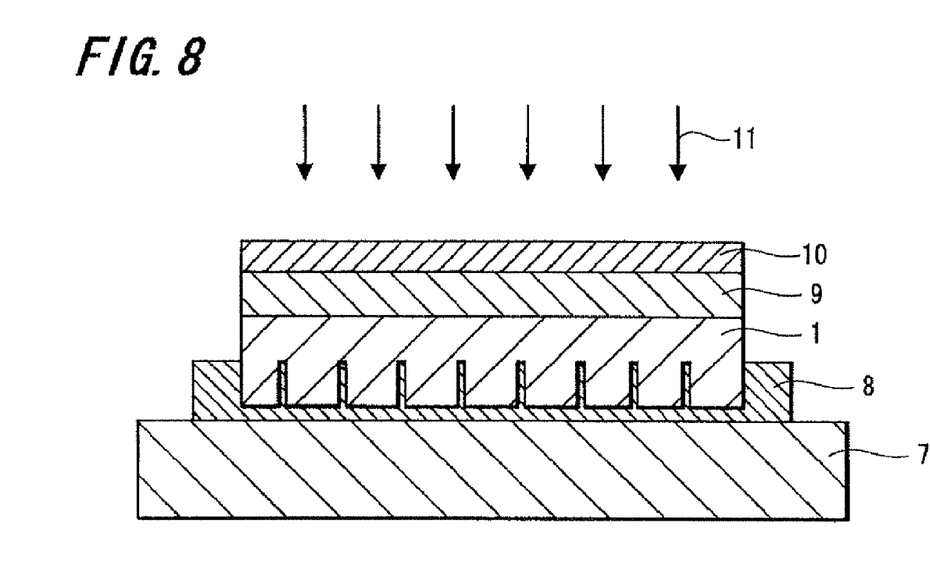
FIG. 8 is a process view (6) showing an embodiment of the method of manufacturing a semiconductor device according to the present invention and is a cross-sectional view of a state where light irradiation is carried out after forming a carbon film on a back surface electrode.

Next, light irradiation 11 is carried out as shown in FIG. 8 after depositing the carbon film 10. Upon the light irradiation 11, the carbon film 10 is heated by absorbing light, heat of the carbon film 10 is transferred to an interface between semiconductor and metal electrode through the metal electrode 9 to heat near the interface, and semiconductor/metal alloy is formed. The metal electrode 9 is brought into so-called ohmic contact with the semiconductor substrate 1.

The light irradiation may be carried out at an irradiation power density of 1 $kW/cm^2$ to 1 $MW/cm^2$ for a short time of 0.01 ms to 10 ms. When the irradiation power density is less than 1 $kW/cm^2$ in the short-time irradiation, a temperature at the interface between the silicon substrate 1 and the metal electrode 9 may not increase, making it difficult to form an intended alloy. When performing irradiation at a power density of more than 1 $MW/cm^2$ in a time range of 0.01 ms to 10 ms, a treatment temperature is so high that such problems occur as evaporation of the substrate supporting wax, displacement of the substrate and rediffusion of the diffused layer. Accordingly, irradiation may need to be performed for a time shorter than above; however, in this case, only the surface layer of the metal electrode 9 is heated to a high temperature and the temperature at the interface between the silicon substrate 1 and the metal electrode 9 may not increase, making it difficult to form an intended alloy. When the irradiation time is less than 0.01 ms within the above power density range, an intended temperature may not be obtained, making it difficult to form an intended alloy. When the irradiation time is more than 10 ms, the treatment temperature is too high, causing the aforementioned problems to occur.

As a specific example of an irradiation light source, a xenon flash lamp may be used in order to complete heat treatment of a place irradiated with light for an irradiation time of 1 ms, for example. When an Au single layer electrode having a thickness of 1.8 μm has been formed as the metal electrode 9 being a back surface electrode and the carbon film 10 being a light absorbing layer having an optical absorbance of 70% has been formed with a thickness of 0.2 μm, eutectic reaction of Au and silicon occurs in the contact layer by irradiating a surface with irradiation light at a power density of 24.7 $kW/cm^2$ for 1.5 ms, causing an ohmic contact. On the other hand, when annealing is performed using a flash lamp without a carbon film, almost all light is lost by reflection even if a high power light source is used and thus an annealing effect may not be achieved.

When annealing is performed for a time longer than 1.5 ms, silicon atoms are deeply diffused at a high concentration in the Au film during laser irradiation and the carbon film in contact with the molten Au surface layer may be reacted with the diffused silicon atoms. An Au—Si—C compound is formed by this reaction. This compound slightly deteriorates conductivity of an electrode. If conductivity deterioration caused by the Au—Si—C compound is not preferred, it is possible to provide a barrier layer between the Au and the carbon in order not to bring the molten Au into contact with the carbon. The barrier layer is not particularly limited insofar as the barrier layer is not molten at a melting temperature of Au. The barrier layer may be an $SiO_2$ film or $SiN_x$ film deposited by CVD or sputtering, for example. The barrier layer may also be a coated insulating film such as a spin-on-glass film. Such a barrier layer has no problem if etched after etching the carbon film.

The light irradiating condition is not limited thereto. The same annealing effect has been obtained by performing pulse irradiation on an irradiation object having the same substrate structure, using a light source at an irradiation power density of 70 kW/cm² for about 0.18 ms. The time for irradiation of light pulse is not limited to the aforementioned time and may be shorter than that if the power density is increased. The time for irradiation of light pulse may be short time of 0.01 ms at a power density of 220 kW/cm², for example.

The light irradiating power is not limited to the value in the above specific example and is determined depending on a substrate thickness, an electrode structure and a specification of a flash lamp. For example, when a carbon film having a thickness of 0.2 μm is provided as a light absorbing layer for a (0.2 μm) Au/(2 μm) Cu/(0.3 μm) Ni/(2 μm) Au/(50 μm) Si structure as shown in FIGS. 5 and 6 as a back surface electrode, silicon/Au alloy by annealing may be achieved by annealing a surface of the carbon film using a flash lamp at a surface irradiating power density of about 20 kW/cm² at a pulse width of 1 ms.

Alternatively, heat treatment for a whole substrate surface may be completed by providing an appropriate optical system between a flash lamp that is a light source and a substrate that is an irradiation object; irradiating only a narrow area with lamp light at a high power density; and irradiating the substrate with light of a plurality of pulses while shifting the irradiated area, for example.

Further, when the silicon substrate 1 is highly insulated thermally from the support base 7 by selecting a material having a low thermal conductivity as the substrate adhesion wax 8, heat treatment may be completed by irradiating a place with a plurality of light pulses each of which has a power density too low to heat to 450° C. However, it is more preferable to select a specification of a light irradiating mechanism with which heat treatment of a whole substrate may be completed by one-pulse irradiation.

Since the pulse irradiating time is as short as 10 ms or less, light irradiation may be performed in the air with respect to an atmosphere control. A pressure in the atmosphere is also not particularly limited. However, it is more desirable if the atmosphere is strictly controlled in an atmosphere of inert gas such as nitrogen or argon, with an effect of suppressing oxidation of a metal surface.

Figure 9:
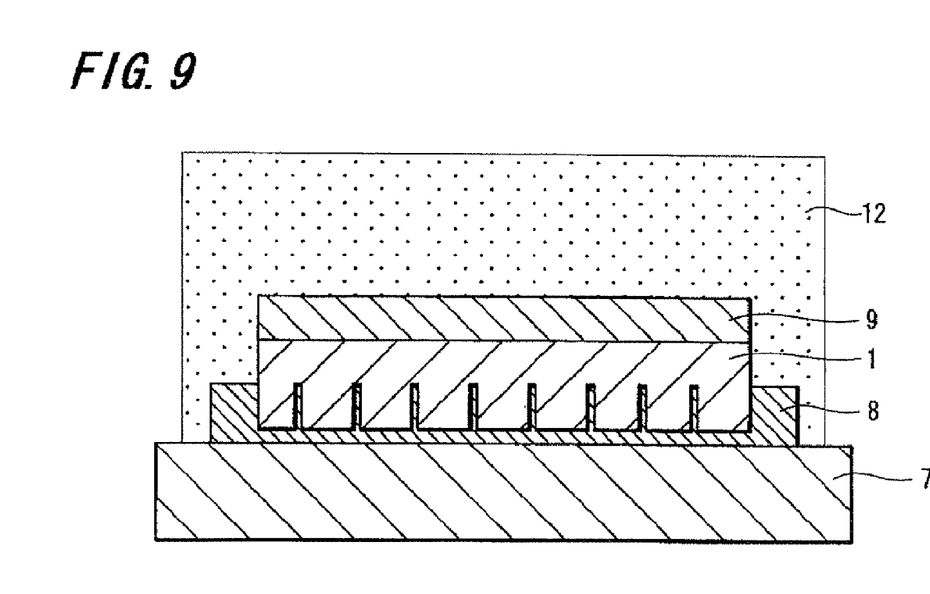
FIG. 9 is a process view (7) showing an embodiment of the method of manufacturing a semiconductor device according to the present invention and is a cross-sectional view of a state where a carbon film is removed by oxygen plasma after light irradiation.

Next, as shown in FIG. 9, the metal electrode 9 may be exposed on an outermost surface by asking the carbon film 10 using oxygen plasma 12 after completion of the above light irradiation. The substrate may be treated at room temperature; however, the carbon film may be removed faster if the substrate is heated to about 50° C. to 100° C. When the carbon film 10 is a carbon fine particle deposited film, the carbon film may be removed by wet washing after the light irradiation.

Figure 10:
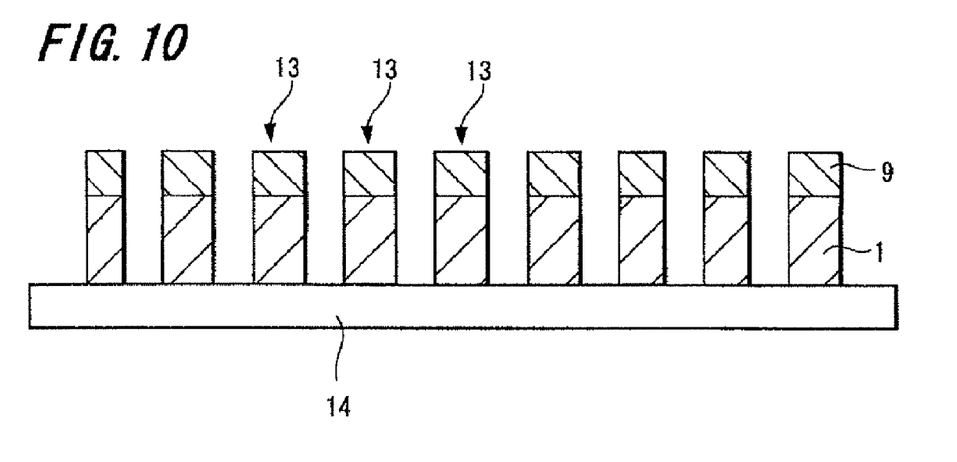
FIG. 10 is a process view (8) showing an embodiment of the method of manufacturing a semiconductor device according to the present invention and is a cross-sectional view of a state where respective dies are singulated from a semiconductor substrate.

Next, as shown in FIG. 10, the silicon substrate 1 is removed from the support base 7 and respective dies (so-called semiconductor chips) 13 are singulated. In the singulation process, since the notched part 6 is formed to a middle in the substrate, the substrate may be simply separated at the notched part 6 and dies are easily singulated. In order to singulate the dies, as shown in FIG. 10, for example, the wax 8 is removed to detach the silicon substrate 1 after completion of the preceding process, and then the silicon substrate 1 is attached to a dicing tape 14 having pressure sensitive adhesion. The dicing tape 14 is stretched from both sides to stress the silicon substrate 1, the silicon substrate 1 is split at the notched part 6 and the respective dies 13 are singulated. Furthermore, the respective dies 13 are arranged at predetermined intervals in the singulated state. Manufacture of intended semiconductor dies is completed in this manner.

Subsequently, a back surface of the dicing tape 14 is irradiated with ultraviolet rays to eliminate pressure sensitive adhesion, and a process of mounting the respective dies 13 follows.

Another singulation process may be performed by a method using a ultrasonic wave. The silicon substrate 1 retained on the support base 7 is dipped in a cleaning tank having water or an organic solvent and is subjected to ultrasonic washing in which the wax is removed by ultrasonic vibration, as well as necessary heating. During this ultrasonic washing, the silicon substrate 1 is split at the notched part 6 and dice are singulated by ultrasonic vibration. In the mounting process thereafter, each dried chip is mounted at a predetermined position one by one through a mounting jig.

When the above heat treatment process is employed, an ohmic characteristic of the contact between the surface electrode and the semiconductor surface may be obtained only by flash lamp annealing on the back surface according to the present invention in optimized condition. That is, in FIG. 1, for example, it is also possible to improve an ohmic characteristic of the contact between the base electrode 5B and the emitter electrode 5E. This is because annealing with only a small temperature difference in a substrate thickness direction may be obtained with the thinning step of substrate according to the process of the present invention. Thinned substrate by the grinding itself may save the irradiation light energy, in addition to a carbon film which suppresses light reflection loss of the electrode surface and save power of the light source.

A preferred embodiment of the present invention may have a modification in addition to the aforementioned example. For example, the aforementioned embodiment shows a method of performing half-dicing before grinding the back surface of the substrate to thin the substrate; however, in another embodiment, it is possible to avoid half-dicing and perform dicing from the back surface after performing thinning, forming the back surface electrode and annealing to improve the contact between back surface electrode and semiconductor.

Further, in another embodiment, it is possible to avoid half-dicing and detach the silicon substrate 1 from the support base 7 and perform dicing from the front surface after thinning, forming the back surface electrode and annealing to improve the contact between back surface electrode and semiconductor.

Annealing using a flash lamp is described in the above light irradiation; however, the light irradiation is not necessarily limited to the flash lamp. Annealing with short-time light irradiation treatment using laser light may be performed, for example. The short-time irradiation may be performed by a method using a pulse wave laser or a method of scanning a sample surface with continuous wave (CW) laser light having a reduced beam diameter.

One example thereof will be described below. A 1.8 μm-thick Au electrode was formed as a back surface electrode for a silicon substrate having a diameter of 200 mm thinned to a thickness of 50 μm, and a carbon film having an optical absorbance of 80% at a wavelength of 808 nm was deposited on the Au electrode. A CW semiconductor laser at a wavelength of 808 nm was used as a light source. A beam size of laser light having a power of 20 W was reduced to a round beam having a diameter of 180 μm on an irradiation surface (carbon film surface) using a focusing optical system. Here, almost Gaussian-type intensity distribution of a laser spot was obtained and a center of the beam had a power density of about 70 kW/cm². The surface was scanned with this laser light at a rate of 1 m/s. Accordingly, one position on the sample surface was irradiated with the laser light for an irradiating time of 0.18 ms. Here, a peak temperature at an Au/carbon interface reached 1000° C. or more and alloy of silicon and Au was obtained. A desired ohmic contact was obtained in this manner. An area irradiated with light per second may be about 9 cm² using a 100 W laser. That is, a time necessary for treating a whole surface of a substrate having a diameter of 200 mm may be one minute or less and a high throughput may be achieved.

As described above, substrate thinning is becoming an important technology in recent years due to a demand for a reduction in weight and size in packaging. According to the present invention, it is unnecessary to care for a yield reduction caused by cracks or the like in a substrate during handling such as transportation of the substrate. According to the present invention, it is possible to achieve extremely fast heat treatment to improve a contact. Moreover, light irradiation is performed through a carbon film having a high optical absorbance, thereby converting light energy to heat energy with high efficiency and saving energy in a heat annealing step. Moreover, a series of treatment ended with singulation may be performed stably and accurately and a highly reliable semiconductor device may be manufactured with a high yield.

EXPLANATION OF REFERENCE NUMERALS

1 substrate, 2 epitaxial layer, 3 n⁺ layer, 4 p⁺⁺ layer, 5B base electrode, 5E emitter electrode, 6 notched part, 7 support base for grinding, 8 wax, 9 back surface electrode, 10 carbon film, 11 light irradiation, 12 oxygen plasma, 13 die (semiconductor chip), 14 dicing tape

The invention claimed is:

1. A method of manufacturing a semiconductor device, characterized by comprising: forming a notched part by dicing from a surface to a middle in a semiconductor substrate and fixing the surface of the semiconductor substrate to a substrate support base; grinding a back surface of the semiconductor substrate to thin the semiconductor substrate; depositing a metal layer on the back surface of the semiconductor substrate and forming a diamond-like carbon film or an amorphous carbon film (hereinafter referred to as "carbon film") that is a heat receiving layer on the metal layer; irradiating a surface of the carbon film with light at a power density of 1 kW/cm.sup.2 to 1 MW/cm.sup.2 for a short time of 0.01 ms to 10 ms to heat treat the metal layer and a semiconductor in contact with the metal layer at a predetermined temperature; and separating the semiconductor substrate at the notched part into pieces.

2. A method of manufacturing a semiconductor device, characterized by a surface of the semiconductor substrate to the substrate support base and then grinding and etching a back surface of the semiconductor substrate to thin the semiconductor substrate; depositing a metal layer on the back surface of the semiconductor substrate and forming a diamond-like carbon film or an amorphous carbon film (hereinafter referred to as "carbon film") that is a heat receiving layer on the metal layer; irradiating a surface of the carbon film with light at a power density of 1 kW/cm.sup.2 to 1 MW/cm.sup.2 for a short time of 0.01 ms to 10 ms to heat treat the metal layer and a semiconductor in contact with the metal layer at a predetermined temperature; and dicing the semiconductor substrate into pieces.

3. The method of manufacturing a semiconductor device according to claim 1, characterized in that the metal layer is formed of one layer or a plurality of layers.

4. The method of manufacturing a semiconductor device according to claim 2, characterized in that the metal layer is formed of one layer or a plurality of layers.

5. The method of manufacturing a semiconductor device according to claim 1, characterized in that the light irradiation is pulse irradiation using a flash lamp as a light source.

6. The method of manufacturing a semiconductor device according to claim 2, characterized in that the light irradiation is pulse irradiation using a flash lamp as a light source.

7. The method of manufacturing a semiconductor device according to claim 1, characterized in that the light irradiation is pulse irradiation using pulse wave laser light as a light source.

8. The method of manufacturing a semiconductor device according to claim 2, characterized in that the light irradiation is pulse irradiation using pulse wave laser light as a light source.

9. The method of manufacturing a semiconductor device according to claim 1, characterized in that the light irradiation is carried out by beam scanning using continuous wave laser light as a light source.

10. The method of manufacturing a semiconductor device according to claim 2, characterized in that the light irradiation is carried out by beam scanning using continuous wave laser light as a light source.

11. The method of manufacturing a semiconductor device according to claim 1, characterized in that the carbon film is a film obtained by depositing carbon fine particles having a particle size of 1 .mu.m or less.

12. The method of manufacturing a semiconductor device according to claim 2, characterized in that the carbon film is a film obtained by depositing carbon fine particles having a particle size of 1 .mu.m or less.

13. The method of manufacturing a semiconductor device according to claim 11, characterized in that the deposited film is formed by applying the carbon fine particles dispersed in water or a silicone oil nonpolar solvent by spin coating.

14. The method of manufacturing a semiconductor device according to claim 12, characterized in that the deposited film is formed by applying the carbon fine particles dispersed in water or a silicone oil nonpolar solvent by spin coating.

* * * * *